June 30, 1959 W. A. OGLETREE 2,892,979

DIODE AMPLIFIER

Filed Feb. 15, 1955

INVENTOR.
WILLIAM A. OGLETREE

BY Thomas B. Horton

AGENT 2,892,979

DIODE AMPLIFIER

William A. Ogletree, Southampton, Pa., assignor to Burroughs Corporation, Detroit, Mich., a corporation of Michigan Application February 15, 1955, Serial No. 488,292

2 Claims. (Cl. 332—9)

This invention relates to amplifiers and more particularly to pulse amplifiers.

Known pulse amplifiers, or amplifiers having a short duty cycle, consume considerable amounts of filamentary power, a good part of which is wasted between duty cycles. This invention seeks to solve the problem of wasted power between duty cycles by the provision of a diode amplifier with very low standby power requirements.

This invention utilizes the dynamic impedance characteristics displayed by a semiconductor device such as a germanium junction diode when the device undergoes a change in its conductive state. Electronic conduction in a semiconductor material hereinafter referred to as germanium is usually described in terms of "carriers." Carriers may be either excess electrons which act as negatively charged current carriers or they may be "holes" which are places where electrons are missing from the valence bond structure of the crystal and which act as positively charged current carriers.

Current carriers are injected into the germanium diode by the application thereto of a forward voltage, that is, a voltage whose polarity is such that the anode is more positive than the cathode. This effect of carrier injection takes a finite time period after the forward voltage is applied so that the diode requires a small time period before there are enough carriers created to conduct the full forward current indicated by the steady state D.C. rating of the diode. The forward recovery period, which is the time required for a forward current to reach a specified value after the application of a forward voltage pulse to the diode, is of the order of only a small fraction of a microsecond and may be considered negligible. Forward current is defined as current flowing from the anode to the cathode of the diode.

Conversely, after conducting in a forward direction it takes a finite time for the current carriers to be swept out of the germanium upon application thereto of a reverse voltage, that is, a voltage having a polarity such that the cathode is more positive than the anode of the diode. This finite time is much longer than that required for establishing the carriers, generally being several microseconds. The reverse voltage does not create carriers but utilizes those already existing to maintain a current flow in the reverse direction, or from cathode to anode. This reverse current is maintained only as long as current carriers exist. As the current carriers are swept from the germanium under the impetus of the reverse voltage, the rated high back resistance of the diode is established.

The reverse recovery period which is the characteristic with which this invention concerns itself is the time required for a germanium junction diode to regain a specified high back resistance after application thereto of a reverse voltage pulse. The reverse performance of the germanium junction diode is characterized by a temporarily low back resistance and a resulting high surge of current which decays exponentially as the carriers are removed and the high back resistance is restored. Stated in other words, it takes a considerable time period, such as two microseconds, for the reverse voltage to substantially sweep out the current carriers produced by the forward voltage; and during this time period the diode displays a dynamic impedance characteristic. In the event the forward voltage is removed and no reverse voltage is applied thereto, after a finite time the carriers recombine, that is, the electrons reunite with the holes, and the carriers thereby do cease to exist, so that the dynamic impedance characteristic is a temporary phenomenon. This invention utilizes this temporary dynamic impedance characteristic for producing amplification of a small low-power current signal.

It is an object of this invention to provide an improved amplifier utilizing this dynamic impedance characteristic of semiconductors.

It is another object of the invention to produce a crystal diode amplifier not requiring filament power.

An object of the invention is to provide efficient pulse amplifiers for gating high amplitude power pulses in response to low amplitude power pulses to provide pulse amplification, and, more particularly, to provide such pulse modification for multi-level low amplitude pulses so that an amplitude modulated pulse train may advantageously be obtained.

Therefore in accordance with the invention a crystal diode exhibiting dynamic impedance characteristics is used as a pulse amplifier. In such diodes a relatively long reverse recovery time exists after forward conduction before a high diode back resistance is presented. Therefore it has been found that a low amplitude forward current pulse may be used to set up carriers which serve to pass a high amplitude reverse voltage pulse applied during the recovery period. Thus, when an impedance circuit is coupled to pass current flowing from the high amplitude reverse voltage pulse supply through the diode, the impedance receives a large proportion of the pulse amplitude only when a small forward current is previously passed through the diode to set up carriers and, moreover, as will be discussed, the amplitude of the pulse across the impedance will be a function of the amount of forward current which has previously passed through the diode. An amplified output potential may therefore be derived from either the impedance circuit or the diode.

Other objects and advantages will become apparent when the following description is read with reference to the accompanying drawings of which:

Figures 1, 2, 3, 4, 5, 6:
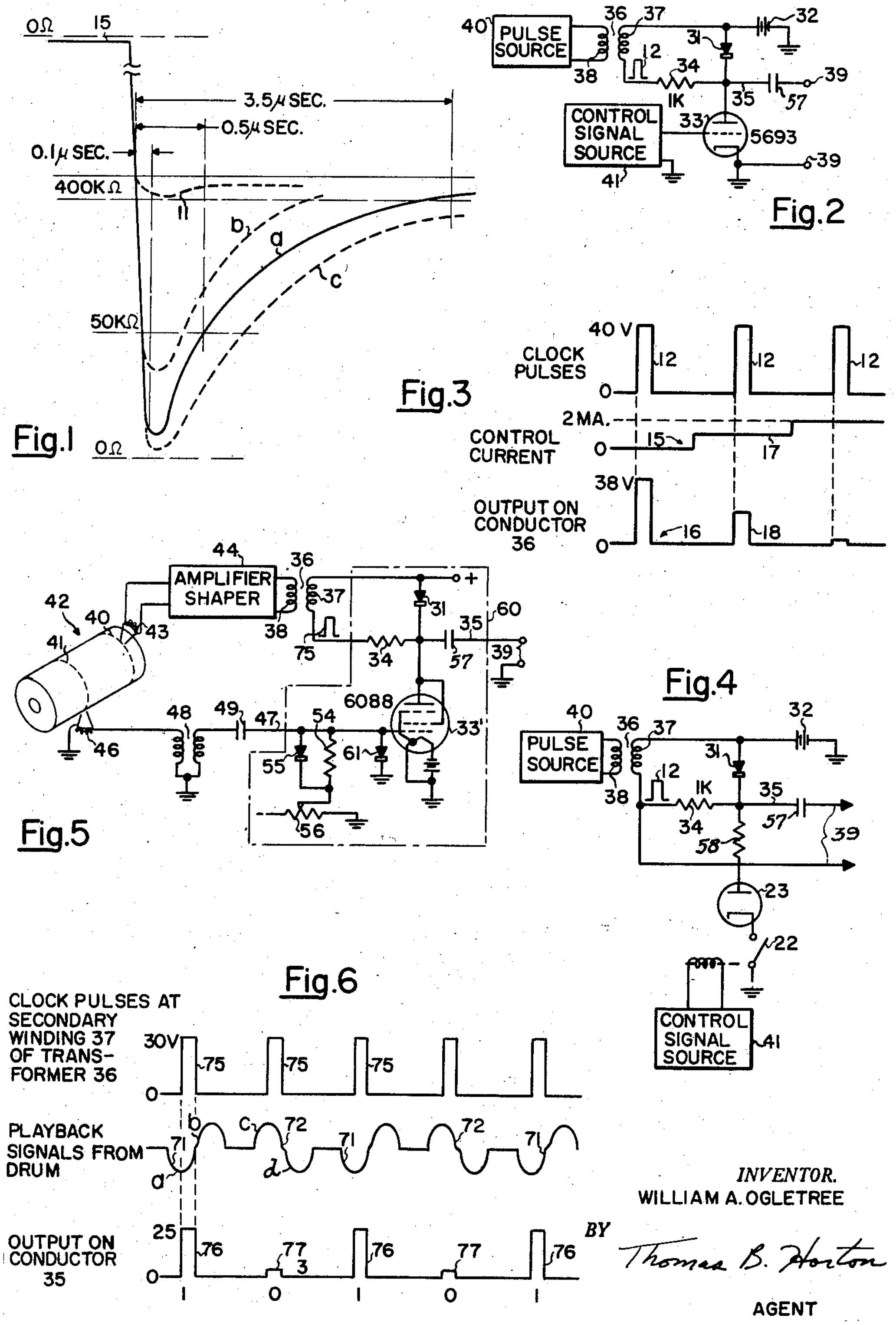
Fig. 1 is a graph showing the dynamic impedance characteristic of a typical junction diode used in the invention.
Fig. 2 is a schematic diagram of an amplifier circuit constructed in accordance with the invention.
Fig. 3 is a series of idealized wave forms used in accordance with the invention.
Fig. 4 is a schematic diagram of a further amplifier circuit constructed in accordance with the invention.
Fig. 5 is a schematic wiring diagram of a system which illustrates the manner in which the diode amplification technique employed in the present invention may be utilized to process digital information read from a magnetic drum.
Fig. 6 is a wave form chart illustrating the operation of the drum readout circuit of Fig. 5.

Characteristic curves of a 1N91 point contact germanium crystal diode are shown in Fig. 1. These curves are typical of those presented by diodes which may be used in accordance with the present invention. In general, junction diodes exhibit the same type of dynamic impedance characteristics which are characterized by the low back resistance and relatively long recovery time due to decay of carriers after a sudden current reversal as exemplified by curves *a*, *b* and *c*. A resistance scale is shown at different ordinate positions to represent respectively the forward and back diode resistance in the upper and lower potrions of the graph. Each of the curves *a, b* and *c* is obtained with sudden current reversal after different values of forward current flow indicated at position 15. Curve 11 represents the back resistance of the diode in absence of a sudden current reversal, such as exhibited by the diode to reverse applied potentials in the absence of forward current flow. It is to be noted that the back impedance with such conditions is high. However with current flow in the forward direction a very low back resistance is presented after a sudden current reversal. The back resistance to some extent depends upon the amount of forward current flow as seen for three different forward current values represented by curves *a, b* and *c*. Thus, in accordance with the teachings of the present invention, as will be discussed, an amplitude modulated pulse train can be generated by selectively varying the amount of forward current flow. In general, within a certain range of currents the greater the forward current, the lower the back resistance and the longer the recovery time. Different types of diodes present different dynamic impedance characteristics and that diode type must be chosen which will afford the required frequency response and output signal.

For Fig. 1 it is seen that circuits designed to operate with a dynamic impedance of less than 50,000 ohms are effective only during the first 0.5 microsecond after the sudden current reversal with the characteristics shown for curve *a*, even though a lower than normal back resistance prevails for about 3.5 microseconds. Therefore the specific circuit design for any particular application will depend upon the diodes used and the amount of forward current available. Circuits for utilizing the dynamic impedance characteristic to obtain amplification are hereinafter described in detail. In general, the diode is used as a non-linear impedance in a divider circuit, and forward signal current is used to control the voltage division of a reverse potential. The duty cycle of operation varies directly with the diode recovery time, and the repetition frequency varies inversely with the recovery time. Thus, short pulses must be used for obtaining output signals from diodes having fast decaying carriers. Accordingly, a slow recovery time is desirable for high amplification, whereas a short recovery time is necessary for higher operation frequency. In general the amount of current necessary to set up the carriers is much less than the amount of current necessary to remove or discharge the carriers. Thus a small forward current may be used to control a large reverse current to afford the diode amplification possible with circuits such as shown in Fig. 2.

In Fig. 2 a germanium junction diode 31 has its anode connected to the positive terminal of a source of D.C. potential 32 which has its negative terminal grounded. The cathode of the diode 31 is coupled to the plate of a triode 33 whose cathode is also grounded. A load resistor 34 and the secondary winding 37 of a power transformer 36 are connected in series across the diode 31. An output conductor 35 is projected from the common juncture point of resistor 34, diode 31, and triode 33 to one of a pair of output terminals 39. A capacitor 57 is provided in conductor 35 where it is necessary to isolate the output terminal from the D.C. path through the potential source 32. The remaining output terminal 39 in this embodiment of the invention is coupled to ground. The primary winding 38 of transformer 36 is coupled to pulse power source 40. The latter functions to supply the primary winding 38 of transformer 36 with high-power periodic clock pulses which appear in the secondary winding 37 of the transformer as 40 volt pulses 12 having an 0.1 microsecond width and presenting a positive polarity at the cathode of the 1N91 germanium junction diode 31 to constitute a reverse voltage to the latter.

For the purpose of controlling the forward current flow from the D.C. source 32 through the diode 31, a control signal source 41 is provided to supply control potentials to the grid of the triode 33. The control potentials may take the form of either constant D.C. potentials or periodic pulses; however in the description which follows the control potentials advantageously comprise a plurality of selectable D.C. potential levels ranging from a potential which is effective to cause cutoff of the triode 33 to one which is effective to cause heavy current flow in the triode 33. By exercising control over the magnitude of the forward current flow through diode 31, the equivalent back resistance presented to the reverse voltage of the clock pulse by the diode 31 can be selected from a range of values which vary from a few ohms to several hundred thousand ohms and, hence, an amplitude modulated pulse train can be achieved.

This invention depends for its operation upon the manner in which the clock pulse voltage divides across the series combination of the resistor 34 and the diode 31. The resistor 34 is a fixed resistance having a value of one thousand ohms, and diode 31 presents an impedance value to the clock pulse which may be selectively varied from a value equivalent to tens of ohms resistance to a value equivalent to several hundred thousand ohms resistance. The output potential at output terminals 39 is the pulse, or A.C., potential developed across the diode 31, that is, between the cathode of diode 31 and ground. The proportion of the clock pulse which is developed across the diode 31 is dependent upon the relative magnitude of the reverse impedance of the diode with respect to the magnitude of the impedance of the resistor. For example, if at clock pulse time, the diode is so conditioned that it presents to the clock pulse a reverse impedance equivalent to only a few ohms resistance, practically the entire clock pulse voltage will be developed across the resistance, and little voltage will be developed across the diode 31. On the other hand, if the diode is conditioned to present a reverse impedance of several hundred thousand ohms to the clock pulse, practically the entire clock pulse is developed across the diode. As a further example, if the diode is so conditioned at clock pulse time that it presents to the clock pulse a reverse impedance equal in magnitude to the fixed resistance 34, the voltage pulse divides evenly between the two; and a potential equal in magnitude to half that of the clock pulse is developed across diode 31. Thus it is seen that the voltage developed across diode 31 and applied to output terminals 39 is that part of the total clock pulse which is proportionate to the impedance value of the diode with respect to the sum of the impedance values of the diode 31 and the resistor 34. Because of the high diode back resistance, it serves as an ideal output coupling device. Although the fixed valued impedance 34 has been illustrated as a pure resistance, it is to be understood that if so desired, the fixed impedance may be a reactive impedance or a combination of resistive and reactive impedances.

In order to pass substantially the entire 40 volt clock pulse appearing at the secondary winding 37 of the transformer 36 to output terminals 39, diode 31 must first be conditioned to present a high reverse impedance to the clock pulse. Control signal source 41 so conditions the diode 31 by driving the control grid of triode 33 considerably more negative than its cathode and thereby effecting cutoff of the triode. With triode 33 nonconducting, no carrier setup current flows in diode 31. Consequently, no carriers exist in the diode to conduct a flow of reverse current, and at clock pulse time the diode instantly presents a high reverse impedance of several hundred thousand ohms to clock pulse. Because the reverse impedance of the diode 31 is a great many times larger than that of the resistor 34, substantially all of the clock pulse voltage is developed across the diode and is applied to the output terminals 39. Referring to Fig. 1, waveform 11 illustrates the reverse impedance characteristics of the germanium junction diode under the condition of no forward current flow at the time the reverse voltage of the clock pulse 12 is applied thereto. Due to the voltage drop across the resistor 34 and to other small circuit losses, only about 38 volts of the 40 volt pulse generally appears at the output terminals 39.

Considering the other extreme, assume that it is desired to attenuate the entire clock pulse so that the output potential at the terminals 39 is substantially zero volts. In order to do this the diode 31 must be conditioned to present substantially a zero reverse impedance to the clock pulse voltage. For a circuit having the component values illustrated by Fig. 2 it was found that a plate current of only 2 milliamperes through the triode and the diode is sufficient to set up enough carriers in the 1N91 germanium junction diode 31 so that the diode presents substantially zero impedance to the 40 volt clock pulse. Thus control signal source 41 need only drive the control grid of triode 33 sufficiently positive with respect to its cathode to cause a 2 milliampere current to flow in order to condition diode 31 to present a substantially zero impedance to the 40 volt clock pulse. Therefore at clock pulse time substantially the entire 40 volt clock pulse is developed across the resistor 34; and nothing, or substantially nothing, is developed across diode 31. Hence the output potential across terminals 39 is substantially zero volts. In Fig. 3 the control current is illustrated by waveform 15 and the output potential at terminals 39 is indicated by waveform 16.

A typical reverse impedance characteristic curve for a point contact 1N91 germanium diode in response to different forward control current conditions is shown by the curves *a*, *b* and *c* of Fig. 1. By utilizing selected values of carrier setup current *a*, *b* and *c* the voltage divider relationship between the resistor 34 and the reverse impedance of the diode 31 can be controlled to vary the magnitude of the output potential of waveform 16 at the terminals 39 from substantially zero volts to nearly the clock pulse voltage and thus, as previously indicated, achieve an amplitude modulated pulse train whose amplitude varies in accordance with variations in the control current, which current in turn varies in accordance with the variations in level of the signal from control sourse 41. Thus by application of proper control grid signals to the triode 33, signal source 41 exercises control over the magnitude of the carrier setup current flowing through the diode 31 to control the output potential at terminals 39. For example in Fig. 3 a one milliampere carrier setup current 17 conditions diode 31 so that the output potential 18 at terminals 39 is approximately one half of the clock pulse potential.

A measure of the degree of amplification provided by the germanium junction diode of Fig. 2 may be derived from an analysis of the two opposing currents; that is, the carrier setup current produced by the triode 33 and the current which flows in response to the clock pulse voltage. Under the conditions for completely attenuating the 40 volt clock pulse and producing substantially a zero volt output signal at terminals 39, substantially the entire 40 volt clock pulse is developed across the one thousand ohm resistor 34. Thus a clock pulse current of approximately 40/1000 or 40 milliamperes flows around the closed loop comprising the secondary winding 37, the resistor 34 and the diode 31. Opposing this 40 milliampere clock pulse current through the diode is the 2 milliampere carrier setup current from the D.C. source 32 through the triode 33. Insofar as the output terminals 39 are concerned the two milliampere opposing current cancels the 40 milliampere clock pulse current as effectively as would a signal equal and opposite to the clock pulse current. Hence, to the output terminals 39 the diode produces amplification of the carrier setup current which is equivalent to 40/2, or a current gain of 20.

With respect to voltage gain of the entire circuit, a variation of control grid potential of the triode 33 over a range of four or five volts by the control signal source 41 effects a change in output potential at the terminals 39 over the range from substantially zero volts to nearly 40 volts.

In the circuit of Fig. 2 an increase in the magnitude of the carrier setup current produces a decrease in the magnitude of the output potential at terminals 39. However by utilizing the potential drop across the resistor 34 as the output signal instead of the potential across the diode 31, the opposite is true. That is, an increase in carrier setup current produces an increase in the magnitude of the output signal, and a decrease in carrier setup current produces a decrease in the magnitude of the output signal.

The triode 33 performs a dual function in the circuit of Fig. 2. In addition to controlling the flow of carrier setup current through diode 31 it functions to isolate the clock pulse signal of the pulse transformer 36 from the control signal path. By coupling the tube 33, the power source 32 and the amplifier diode 31 in a series path excluding the clock pulse transformer, the control signal is caused to be effective in establishing carriers in the diode without opposing the clock pulses in the transformer secondary winding 37. Thus by utilizing the shunt feed connection, the circuit does not require that the clock pulse source need be accurately regulated as would be required if the control current were passed serially through the clock pulse winding 37. The resistance of the triode 33 may be relied upon to prevent a sneak path for the clock pulses through the control signal circuit.

In Fig. 4 there is shown a modified version of the diode amplifier circuit. For convenience like components retain the same reference characters as in Fig. 2. A vacuum tube diode 23 is employed or some other type not having a reverse impedance characteristic like that of diode 31 to assure that the control signal only permits forward current flow through the amplifier diode 31. To control the current flow through the amplifier diode 31, the control signal source 41 actuates the switch 22. This switch 22 may be a relay controlled switch as shown or any other type of electronic switch to control current flow from the power supply 32 through the amplifier diode 31 and the vacuum tube diode 23. Since the high amplitude clock pulses 12 are of such polarity that current is passed through the amplifier diode 31 in the reverse direction, they see the low forward resistance of diode 23 and are passed to the switch circuit 22. For this reason the series resistor 58 is supplied to assure that the diode does not form a sneak path for the clock pulses.

In the circuit of Fig. 4, the output terminals 39 are connected across the load resistor 34. This mode of operation is desirable when a constant impedance should be presented at the output terminals 39, or when it is desired to produce a signal opposite in sense from that at the amplifier diode 31. Thus, the presence of current due to closing switch 22 produces a high output signal at terminals 39 in this embodiment of the invention. In general the relative impedances of the amplifier diode 31, the load resistor 34 and the output circuit must be chosen for the required division of the input pulses 12. In this circuit for example, the combined resistance of the load resistor 34 and the output circuit coupled to terminals 39 must be large compared with the dynamic reverse impedance of the amplifier diode 31 if a large output signal potential is required. Conversely the full amplifier diode back resistance should be large compared to the impedance across load resistor 34 to reduce any residual signal in the absence of carrier setup.

In Fig. 5 a diode amplifier circuit 60 is illustrated as it might be utilized in a playback circuit for a magnetic drum wherein binary digital information is stored in the form of differentially magnetized areas on the surface of the drum. The problems to be solved in reading information out of storage are twofold. First, the signals which the differentially magnetized areas induce in a playback head are weak and must be amplified before they can be utilized. Second, the signals must be identified as to their binary value. The diode amplifier is particularly well adapted to the solution of both these problems.

A playback circuit comprising a diode amplifier circuit 60 similar to the diode amplifier of Fig. 2 is utilized to read previously stored binary digital information from the information track 41 of magnetic drum 42. Information track 41 is divided into a plurality of equal peripheral sectors wherein a binary one is recorded by a spot magnetization of one polarity and a binary zero is recorded by a spot magnetization of opposite polarity. Information track 41 is provided with a playback head 46 which is A.C. coupled via transformer 48, capacitor 49, and conductor 47 to the control grid of a miniature type 6088 pentode 33' which controls the flow of carrier setup current for the diode amplifier 31. A binary one recording when played back from track 41 appears on conductor 47 as a substantially sinusoidal voltage signal, as shown by the waveforms 71 of Fig. 6, having a negative-going leading lobe *a* and a positive-going trailing lobe *b*. Conversely a binary zero recording when played back from track 41 appears on conductor 47 as a substantially sinusoidal voltage signal 72 having a positive-going leading lobe *c* and a negative-going trailing lobe *d*. The magnitude of the playback signals on conductor 47 is approximately one volt peak to peak.

A master timing track 40 has a full complement of spot magnetizations, one for each peripheral digit space, which energizes a playback head 43 to effect operation of an amplifier-shaper 44. Amplifier-shaper 44 under control of timing track 40 applies a continuous stream of accurately timed clock pulses to the primary winding 38 of transformer 36. The clock pulses appear in the secondary winding 37 of transformer 36 as 30 volt pulses approximately one microsecond in width as shown by the waveforms 75 of Fig. 6. The relative timing between the clock pulses 75 and the playback signals 71 and 72 is such that a clock pulse occurs just after the peak of the leading lobe of each of the playback signals has passed.

In the diode amplifier circuit 60 the diode 31 has its anode connected to the positive terminal of a D.C. source of potential which is not shown and its cathode connected to the plate of pentode 33'. In order to maintain pentode 33' normally nonconducting, the control grid thereof is maintained slightly below cutoff potential by means of a negative bias furnished by potentiometer 56 via the parallel combination of resistor 54 and diode 55. A diode 61 merely provides a path to ground to prevent the flow of grid current in the tube 33'. The secondary winding 37 of transformer 36 and a load resistor 34 are connected in series across the amplifier diode 31. Finally an output conductor 35 which is provided with a D.C. blocking capacitor 57 is projected from the juncture of diode 31, tube 33' and resistor 34 to one of a pair of output terminals 39.

The operation of diode amplifier 31 is substantially the same as that of Fig. 2. The negative-going leading lobe *a* of a binary one signal drives the control grid of tube 33' even more negative, and it remains cutoff. As a result no carriers exist in the diode 31 at clock pulse time, and the diode presents a very high reverse impedance to the clock pulse 75 as compared to the impedance presented by the resistor 34. Therefore substantially the entire 30 volt pulse is developed across the diode; and, as shown by Fig. 6, output conductor 35 displays substantially the 30 volt signal 76 to indicate binary one. A binary zero signal on conductor 47 has a positive-going leading lobe *c* which drives the control grid of tube 33' sufficiently positive to effect conduction thereof. Conduction of the tube 33' effects injection of sufficient carriers into diode 31 to cause it to present practically no reverse impedance to the clock pulse 75. Therefore substantially the entire clock pulse is developed across resistor 34, and little output potential is developed across diode 31. Hence to indicate binary zero a substantially zero volt output 77 is produced on conductor 35. Actually due to losses in the circuit, the binary one output potential 76 is a few volts less than 30 volts. Also, for the binary zero signal 77 the noise level, or output potential, is a few volts more positive than zero. However a noise ratio of better than 8 to 1 is readily obtained.

It is seen from the foregoing description of the invention that a novel diode pulse amplifier circuit is provided exhibiting features of advantage over prior art devices. Having therefore described the invention and its mode of operation, those features of novelty believed descriptive of the nature and scope of the invention are defined in particularity in the appended claims.

What is claimed is:

1. An electronic circuit including an asymmetrical semiconductive current element having two terminals, said element exhibiting relatively low impedance to current flow therethrough in one direction and relatively high impedance to current flow therethrough in the reverse direction, the value of said high impedance depending upon the number of free charge carriers present in said element at the time said reverse direction current is applied, an impedance means electrically connected in series with said asymmetrical conducting element, a pulse source connected across the series combination of said impedance means and said element for applying a train of successive pulses across said series combination in a direction tending to establish reverse direction current flow through said element, said pulse source producing a succession of pulses across said impedance means each of which has an amplitude dependent upon the impedance of said element at the instant such pulse is applied, a voltage source electrically connected to said element for biasing said element in its forward direction for injecting into said element free charge carriers, and variable impedance means connected in circuit with said voltage source for controlling incrementally said forward direction voltage bias so as to vary in controlled increments the amount of injection of said charge carriers into said element for variably controlling the impedance of said element to pulses from said pulse source so as to produce across said impedance means an amplitude modulation pulse train.

2. An electronic circuit as called for in claim 1 in which the asymmetrical current conductive element is a crystal diode.

References Cited in the file of this patent

UNITED STATES PATENTS

| | | |
|---|---|---|
| 2,627,575 | Meacham et al. | Feb. 3, 1953 |
| 2,647,995 | Dickinson | Aug. 4, 1953 |
| 2,666,816 | Hunter | Jan. 19, 1954 |
| 2,666,861 | Campbell | Jan. 19, 1954 |
| 2,698,427 | Steele | Dec. 28, 1954 |

OTHER REFERENCES

Pub. (I), National Bureau of Standards Technical News Bulletin, vol. 38, No. 10, October 1954, pages 145–147.